(12) United States Patent
Martin

(10) Patent No.: US 6,487,141 B2
(45) Date of Patent: Nov. 26, 2002

(54) DIGITAL DELAY, DIGITAL PHASE SHIFTER

(75) Inventor: Chris G. Martin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/809,730

(22) Filed: Mar. 15, 2001

(65) Prior Publication Data

US 2002/0131319 A1 Sep. 19, 2002

(51) Int. Cl.[7] ................................................. G11C 8/00
(52) U.S. Cl. ....................................... 365/233; 194/240
(58) Field of Search ................................. 365/233, 194, 365/240, 233.5, 189.12, 230.08, 230.06; 327/105

(56) References Cited

U.S. PATENT DOCUMENTS

| | | | | |
|---|---|---|---|---|
| 5,646,904 A | * | 7/1997 | Ohno et al. | 365/233 |
| 5,793,709 A | * | 8/1998 | Carley | 327/105 |
| 6,154,419 A | * | 11/2000 | Shakkarwar | 365/230.03 |
| 6,212,126 B1 | * | 4/2001 | Sakamoto | 365/233 |
| 6,236,619 B1 | * | 5/2001 | Cho et al. | 365/233 |

* cited by examiner

Primary Examiner—David Nelms
Assistant Examiner—David Lam
(74) Attorney, Agent, or Firm—Fletcher, Yoder & Van Someren

(57) ABSTRACT

A technique for shifting the phase of a periodic signal. A periodic signal, such as a clock signal, may be provided in a synchronous system, such as a memory system implementing a Synchronous Dynamic Random Access Memory (SDRAM) device. It may be advantageous to be able to phase shift the signal. The present technique implements a delay line which includes a plurality of delay elements coupled in series. The periodic signal is delivered to the delay line and the time between transitions from high to low or low to high is stored in one of a number of latches coupled to the delay line at various points. A number of tapping elements are also coupled to the delay line at some incremental point corresponding to a correlative latch. By varying the proximity of each tapping element and corresponding latch along the delay line, various phase shifts of the periodic signal can be produced.

79 Claims, 4 Drawing Sheets

DIGITAL DELAY, DIGITAL PHASE SHIFTER

BACKGROUND OF THE INVENTION

1. Field of the Invention

The present invention relates generally to synchronous systems and, more particularly, to a technique for shifting the phase of a signal in a synchronous system.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device which is coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. Memory manufacturers provide an array of innovative fast memory chips for various applications. One type of memory device is a standard Synchronous Dynamic Random Access Memory (SDRAM). Synchronous control means that the DRAM latches information from the processor under the control of the system clock. The processor can be told how many clock cycles it takes for the DRAM to complete its task so that the processor can safely implement other tasks while the DRAM is processing its request. In synchronous systems, and especially high speed synchronous systems, the phase of the clock and data may be carefully controlled to insure that data is not overwritten or otherwise lost as it is clocked through the system.

Because microprocessor technology enables current microprocessors to operate faster than current memory devices, techniques for increasing the speed of memory devices are often implemented. One technique for increasing the speed of a SDRAM is called a "prefetch." In a prefetch system, more than one data word is fetched from the memory on each address cycle. The data may be temporarily stored in a buffer. Multiple words of data can then be sequentially clocked out for each address access. The main advantage of this approach is that for any given technology data can be accessed in multiples of the internal clock rate of the DRAM.

In a Double Data Rate (DDR) memory, the data transfer rate is twice that of a regular SDRAM because the DDR's I/O data can be strobed twice for every clock cycle. Thus, data is sent on both the rising and falling edge of the clock signal rather than just the rising edge of the clock signal as in typical Single Data Rate (SDR) systems. With the increased rate of data transfer in synchronous systems such as DDR systems, matching the clock and data rates becomes more difficult. If the data and clock signals between the controller and memory are out of phase, it may be beneficial to shift the phase of the data or clock to optimize the likelihood of clocking of the data without losing any of the information.

The present invention may address one or more of the problems set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers'specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
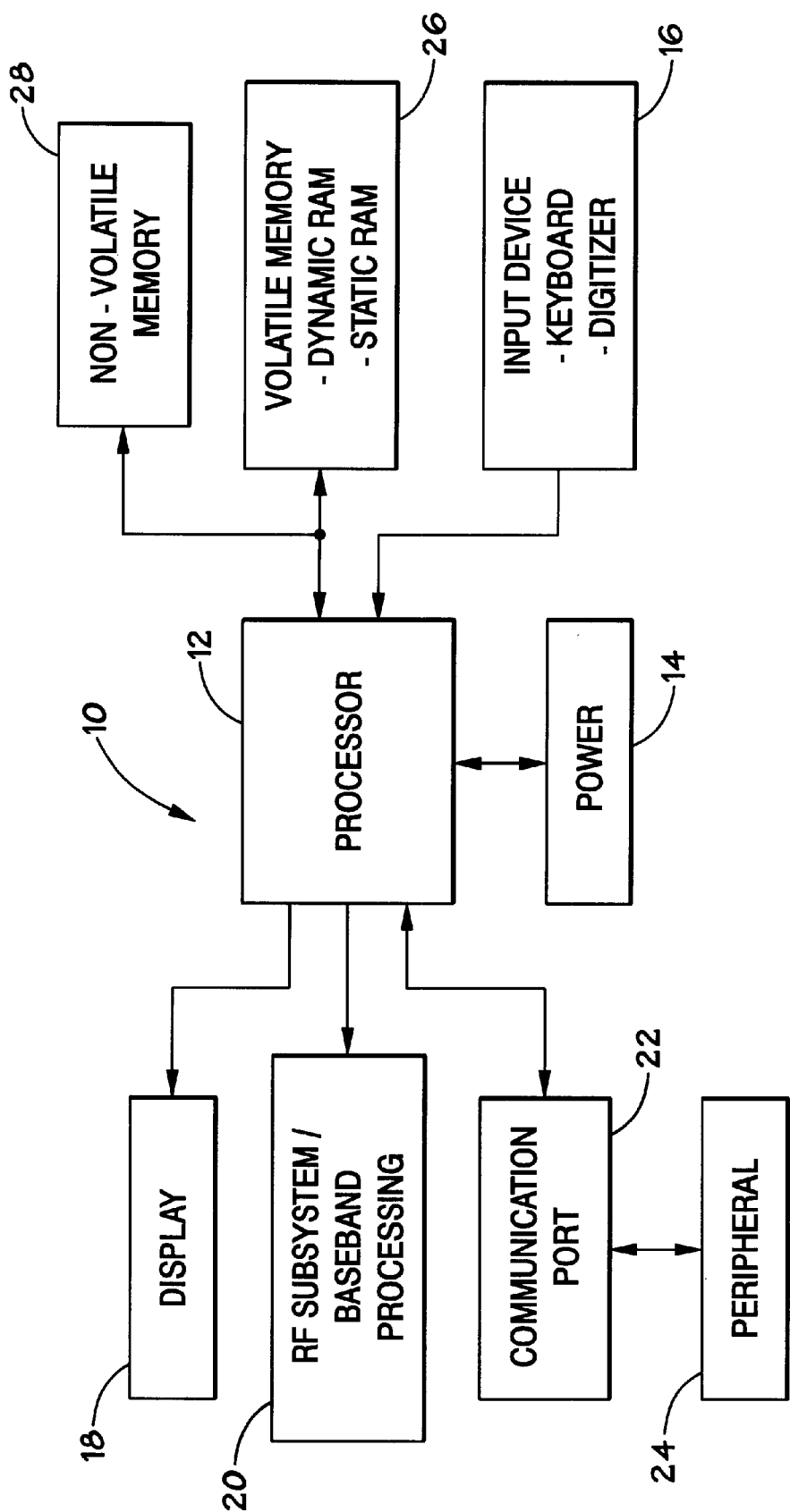
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

Figure 2:
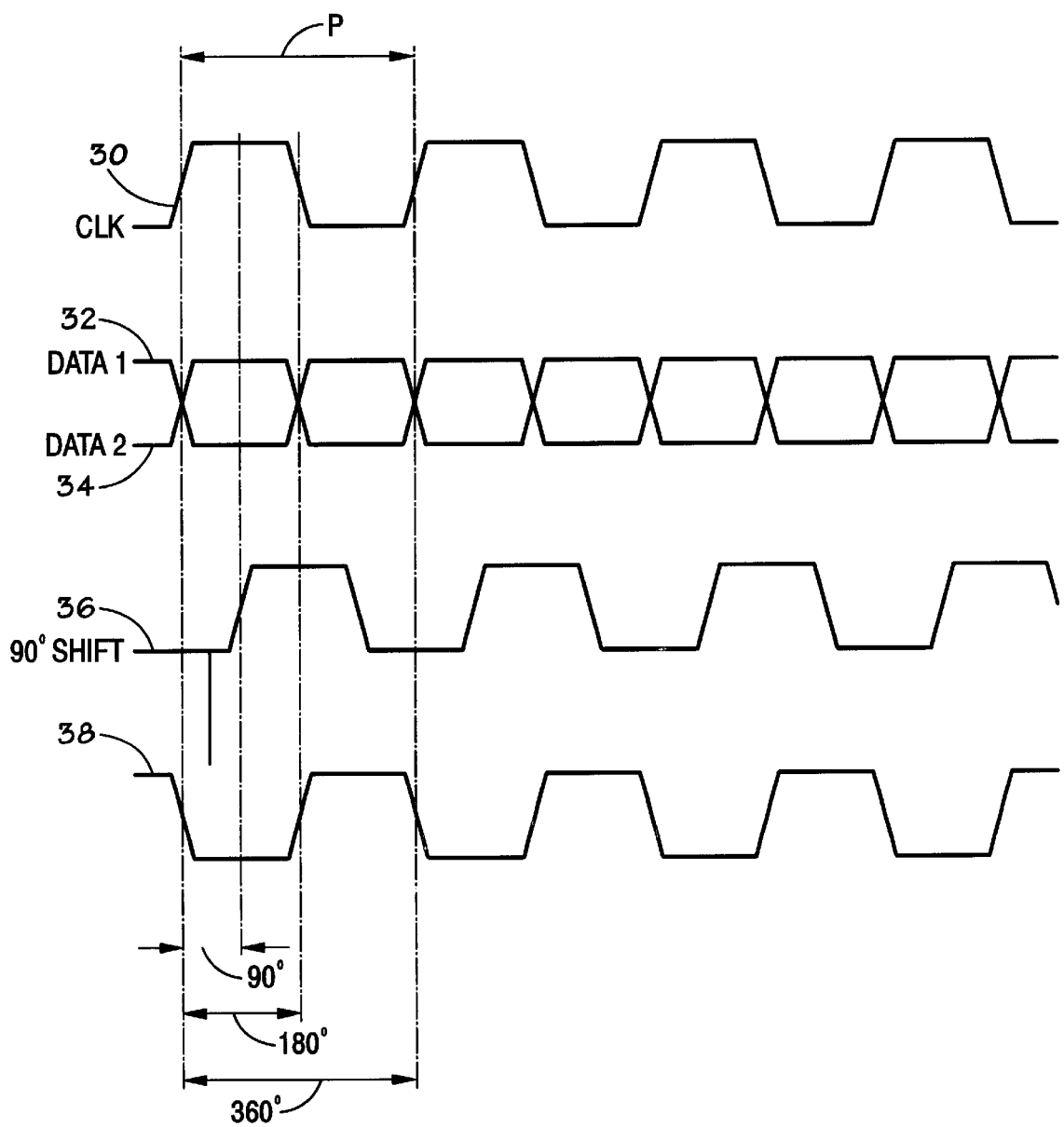
FIG. 2 illustrates a timing diagram of an exemplary DDR SDRAM.

The volatile memory 26 may include a number of SDRAMs which implement DDR technology and operate under a clock signal 30 (CLK), as illustrated in FIG. 2. The clock signal 30 has a period P. The period P corresponds to a 360 degree clock pulse. Data such as DATA 1 and DATA 2, illustrated by reference numerals 32 and 34, may be transferred with the rising and the falling edges of the clock signal 30 in a DDR SDRAM. To maximize the likelihood of capturing DATA 1 and DATA 2 (reference numerals 32 and 34), it may be beneficial to shift the clock signal CLK (reference numeral 30) such that the rising and falling edges of the clock signal CLK fall in the middle of the data pulses, here DATA1 and DATA2. In certain instances, it may be beneficial to shift the clock signal CLK 90 degrees as illustrated by signal 36. In other instances, it may be beneficial to shift the clock signal CLK 180 degrees as illustrated by signal 38. While the embodiments described herein specifically refer to a 90 degree and 180 degree phase shift of the clock signal, it should be appreciated that other shifts in the clock signal CLK are also envisioned in accordance with the present technique. Further, the techniques described herein may be used to shift the data signals DATA1 and/or DATA2 rather than shifting the clock signal CLK. These details are further described with reference to FIGS. 3 and 4 below.

Figure 3:
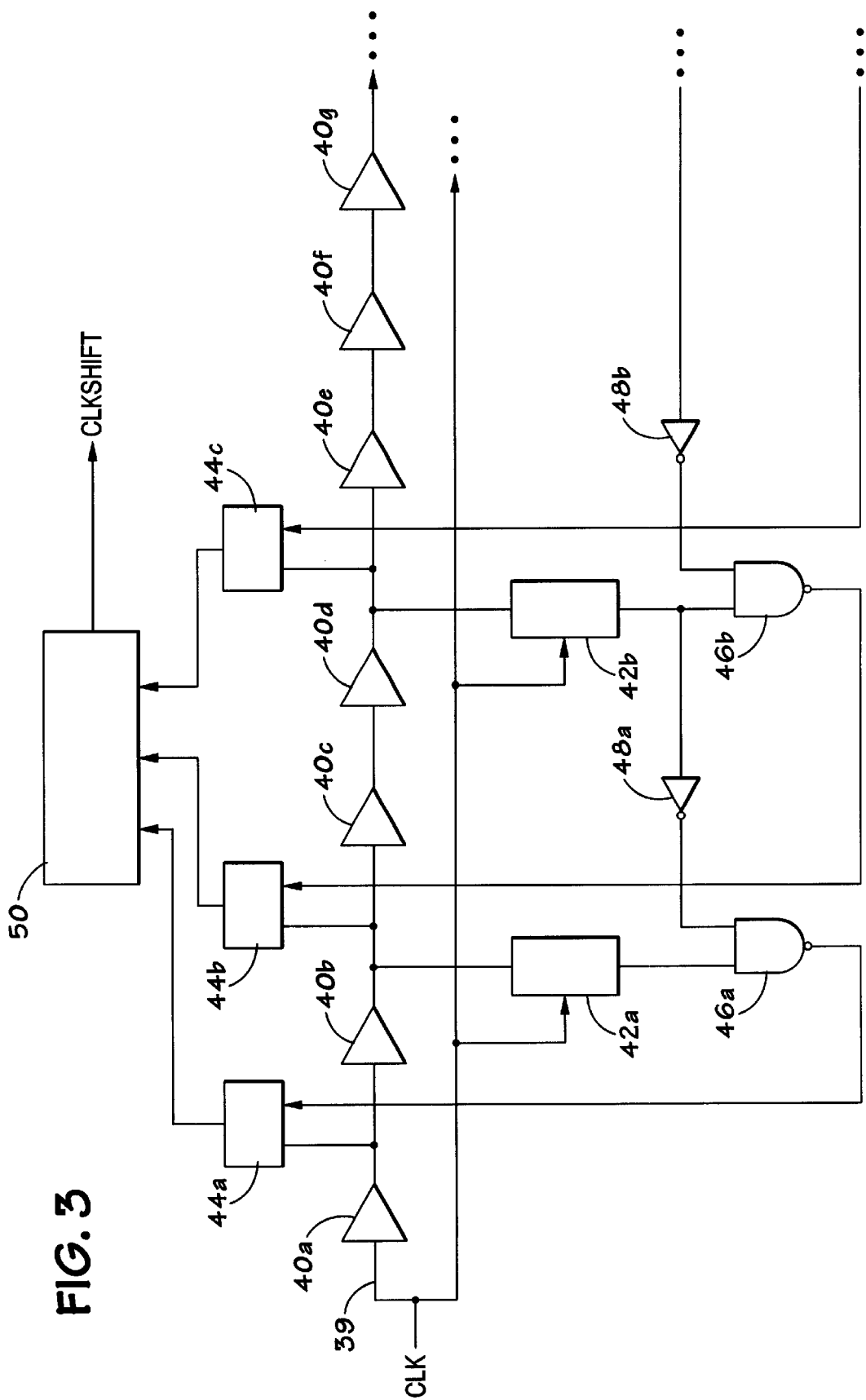
FIG. 3 illustrates a block diagram of an exemplary phase shifting mechanism.

FIG. 3 illustrates a block diagram of a mechanism for identifying the mid-point of a periodic signal (half-period) and approximating a delay which may be used to shift the input signal to a desired phase with respect to the data. The mechanism provides a delay line 39 to track the amount of time between transitions (from high to low or low to high) of the input signal. By determining the amount of time it takes from one transition to the next and equating that to a 180 degree point in the period of the input signal, the input signal can be shifted to a desired point, based on the half-period estimation. For a 180 degree detection circuit, as illustrated in FIG. 3, the circuit provides for a delay determined by a rising edge or a falling edge of the input signal. If the signal operates at a 50% duty cycle, this circuit would be sufficient to approximate the shift for the entire signal accurately. However, for an input signal which operates on a duty cycle other than a 50% duty cycle, a 360 degree detection circuit may be more desirable. A 360 degree detection circuit tracks the dual transition from high-to-low-to-high or from low-to-high-to-low. In this way, the signal shift based on the approximated full-period will be correct. If an approximation of a period based on an input signal that does not have a 50% duty cycle is calculated based on a half-period, the phase shift may be incorrect.

The shifting mechanism for the present technique incorporates a delay line 39 comprising a chain of delay elements 40*a*–*g*. The number of delay elements 40*a*–*g* dictates the precision of the period approximation for the input signal being shifted. The delay elements 40*a*–*g* are connected in series. A plurality of storage elements, such as latches 42*a*–*b*, and tapping elements 44*a*–*c* are coupled at various points along the chain of delay elements 40*a*–*g*. The proximity of the latches 42*a*–*b* and tapping elements 44*a*–*c* dictates the shift in the input signal. The latches 42*a*–*b* are used to track how far along the delay line 39 the input signal transitions between high and low states. If the input signal, such as the clock signal CLK, has a 50% duty cycle, each clock transition from high-to-low or from low-to-high corresponds to the midpoint or 180 degree phase of the signal. By tracking the number of delay elements 40*a*–*g* the input signal CLK went through before transitioning, the period of the input signal CLK can be approximated. Thus, the input signal CLK can be shifted in an approximate increment of the phase.

In the specific embodiment illustrated in FIG. 3, the latch 42*a* is coupled to the chain of delay elements 40*a*–*g* after the first two delay elements 42*a* and 42*b*. If the input signal CLK transitions after passing through the first two delay elements 42*a* and 42*b*, the information will be latched to the tapping element 44*a* through a NAND gate 46*a*. Each tapping element 44*a*–*e* may include a plurality of components, as further illustrated in FIG. 4, or may include only a single component, such as a NOR gate, for example. If the input signal CLK has a 50% duty cycle, the half-period of the input signal CLK can be approximated relative to the delay elements 40*a* and 40*b*. Because the tapping element 44*a* is coupled to the latching circuit 42*a* and further coupled to the delay line 39 after only one delay element 40*a*, the input signal CLK is shifted approximately 90 degrees. If the input signal CLK transitions after two delay elements 40*a* and 40*b*, the half-period of the input signal CLK is approximately equal to two delay elements. Thus, one delay element represents a 90 degree phase shift (or half of the half-period). Likewise, if the input signal CLK does not transition until after passing through four delay elements 40*a*–*d*, the latch 42*b* will capture the half-wave period of approximately four delay elements and latch the information to the tapping circuit 44*b* through a NAND gate 46*b*. Because the tapping element 44*b* is coupled to the delay line 39 after two delay elements (or half of the number of delay elements as the latch 42*b* corresponding to the tapping element 44*b*), the input signal CLK will again be shifted 90 degrees (or half of the half period). The inverters 48*a* and 48*b* provide additional logic to insure that only one tapping element 44*a*–*c* is enabled at a time. The output of each tapping element 44*a* can be combined in a combining and driving circuit 50, which may be a series of NAND gates, for instance, to produce a single shifted output signal, such as CLKSHIFT.

It should be clear that various arrangements of latches 42a–b and tapping elements 44a–c may be desirable for different applications. If, for instance, a 60 degree phase shift is desired, a latch may be coupled to the delay line after three delay elements. The latch then provides an input to a tapping circuit which is coupled to the delay line after one delay element. This provides for a shift of approximately one-third of the half-period, or 60 degrees. The smaller the delay element, the more finite the phase-shifting capabilities of the circuit. Further, if the input signal has something other than a 50% duty cycle or if latching is only desired for some multiple of the clock cycle, additional components, such as a counter, may be placed before the latches 42a–b. The input signal is sent through a counter which tracks the number of signal transitions from low-to-high or high-to-low. The additional components may be used to insure that the phase shifting circuit only shifts the input signal after a full period is received, i.e. after transitions from low-to-high-to-low or from high-to-low-to-high. This insures that a full period is measured and that the shift is based on the full period, which may be desirable for a non-50% duty cycle input signal.

Figure 4:
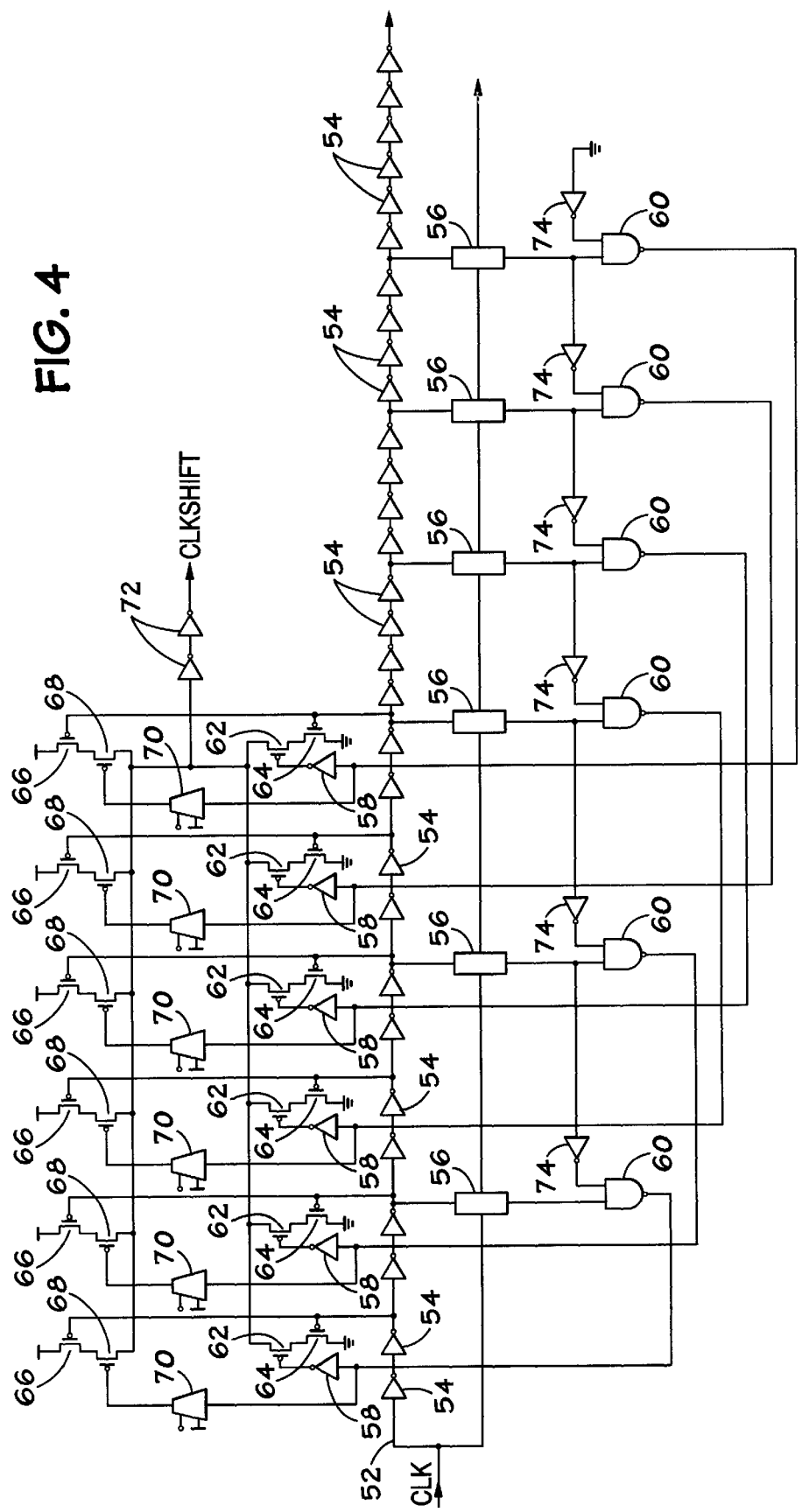
FIG. 4 illustrates a schematic diagram of one embodiment of a phase shifting circuit in accordance with the present technique.

FIG. 4 illustrates one embodiment of a phase shifting circuit in accordance with the technique described herein. It should be understood that there are many functional equivalents to the elements described with reference to FIG. 4 and the exemplary schematic is only presented as one illustration of a circuit which incorporates the system as described with reference to FIG. 3. Further, while FIGS. 3 and 4 refer to a clock (CLK) signal being input into the circuit, any periodic signal can be shifted using the present techniques.

Turning now to FIG. 4, an input signal CLK is directed through a delay line 52. The delay line 52 comprises a plurality of delay elements 54. For the sake of clarity, since elements are repeated in each segment of the circuit, like elements are designated with like reference numerals and the discussion referring to each reference numeral is applicable to each segment. The number of delay elements 54 may vary depending on the particular needs of the system or user. The input signal CLK is also directed to a plurality of latches 56. The latches 56 will store information regarding the transition of the input signal CLK, as discussed with reference to FIG. 3. In the present embodiment, each latch 56 is coupled to the delay line 52 after every four delay elements 54 (as compared to after every two delay elements, as illustrated in FIG. 3). Each latch 56 latches input signal CLK transition data to a corresponding inverter 58 through a NAND gate 60. Each inverter 58 provides an input to the gate of a corresponding transistor 62 (here, an n-channel MOSFET). The drain of the transistor 62 is coupled to the source of a second transistor 64 (here an n-channel MOSFET). The drain of the second transistor 64 is coupled to ground. The gate of each transistor 64 is coupled the delay line 52 after half of the delay elements 54 for the corresponding latch 56 of a given segment. For example, the first latch 56 is coupled to the delay line 52 after the fourth delay element 54. The corresponding transistor 64 is coupled to the delay line 52 after the second delay element 54. Likewise, the second latch 56 is coupled to the delay line 52 after the eighth delay element 54. The corresponding transistor 64 is coupled to the delay line 52 after the fourth delay element, and so forth. This configuration of latches 56 and transistors 64 relative to each other and the delay line 52 provides a 90 degree phase shift of the input signal CLK, as discussed with reference to FIG. 3. Further, the same point in the delay line 52 is coupled to the gate of a third transistor 66 (here a p-channel MOSFET). The source of the transistor 66 is coupled to a voltage source. The drain of the transistor 66 is coupled to the source of a fourth transistor 68 (here a p-channel MOSFET). The source of the transistor 68 will produce the phase-shifted signal CLKSHIFT. The delivery of the phase-shifted signal CLKSHIFT is enabled by the NAND gate 60 which delivers the latching information from the latch 56 to the inverter 58 and to a multiplexor 70. The output of the multiplexor 70 delivers a signal to the gate of the corresponding transistor 68. Delay elements 72 may be added to the output of the shifting circuit to drive the phase-shifted signal CLKSHIFT. Finally, inverters 74 may be used to ensure that only one segment of the circuit is enabled at a time by providing a logical mechanism for triggering the latching of the output of each latch 56 through each NAND gate 60.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
    a memory device operatively coupled to the processor and comprising:
    a delay line configured to receive a periodic signal, the delay line comprising a plurality of delay elements coupled in series;
    a plurality of storage elements coupled at intervals to the delay line and configured to store information corresponding to a period of the periodic signal and further configured to latch the information when a transition of the periodic signal occurs along the delay line; and
    a plurality of tapping elements coupled to the delay line and configured to provide a phase shift of the periodic signal.

2. The system, as set forth in claim 1, wherein the memory device comprises a synchronous dynamic random access memory device (SDRAM).

3. The system, as set forth in claim 2, wherein the SDRAM comprises a double date rate (DDR) SDRAM.

4. The system, as set forth in claim 1, wherein the plurality of storage elements comprise latches.

5. The system, as set forth in claim 1, wherein the transition of the periodic signal comprises a transition from a logical high to a logical low.

6. The system, as set forth in claim 1, wherein the transition of the periodic signal comprises a transition from a logical low to a logical high.

7. The system, as set forth in claim 1, wherein the transition of the periodic signal comprises a transition from a logical low to a logical high to a logical low.

8. The system, as set forth in claim 1, wherein the transition of the periodic signal comprises a transition from a logical high to a logical low to a logical high.

9. The system, as set forth in claim 1, wherein the arrangement of the plurality of tapping elements along the delay line is correlative to the phase shift of the periodic signal.

10. The system, as set forth in claim 1, wherein the phase shift is correlative to the delay elements.

11. The system, as set forth in claim 1, wherein each of the plurality of tapping elements comprises a NOR gate.

12. The system, as set forth in claim 1, wherein each of the plurality of tapping elements comprises a plurality of field effect transistors arranged in series with respect to each other.

13. The system, as set forth in claim 1, wherein each of the plurality of tapping elements is coupled to one of the plurality of storage elements through one or more logical elements.

14. The system, as set forth in claim 13, wherein the logical elements comprise NAND gates.

15. The system, as set forth in claim 1, wherein an output of each of the tapping elements is combined in a combining circuit to produce a shifted periodic signal.

16. The system, as set forth in claim 1, wherein each of the tapping elements produces an output and wherein each output is combined through one or more NAND gates.

17. The system, as set forth in claim 1, wherein the periodic signal comprises a clock signal.

18. The system, as set forth in claim 1, wherein the periodic signal comprises a 50% duty cycle.

19. A circuit for shifting a periodic waveform comprising:
  a delay line configured to receive a periodic signal, the delay line comprising a plurality of delay elements coupled in series;
  a plurality of storage elements coupled at intervals to the delay line and configured to store information corresponding to a period of the periodic signal and further configured to latch the information when a transition of the periodic signal occurs along the delay line; and
  a plurality of tapping elements coupled to the delay line and configured to provide a phase shift of the periodic signal.

20. The circuit for shifting a periodic waveform, as set forth in claim 19, wherein the plurality of storage elements comprise latches.

21. The circuit for shifting a periodic waveform, as set forth in claim 19, wherein the transition of the periodic signal comprises a transition from a logical high to a logical low.

22. The circuit for shifting a periodic waveform, as set forth in claim 19, wherein the transition of the periodic signal comprises a transition from a logical low to a logical high.

23. The circuit for shifting a periodic waveform, as set forth in claim 19, wherein the transition of the periodic signal comprises a transition from a logical low to a logical high to a logical low.

24. The circuit for shifting a periodic waveform, as set forth in claim 19, wherein the transition of the periodic signal comprises a transition from a logical high to a logical low to a logical high.

25. The circuit for shifting a periodic waveform, as set forth in claim 19, wherein the arrangement of the plurality of tapping elements along the delay line is correlative to the phase shift of the periodic signal.

26. The circuit for shifting a periodic waveform, as set forth in claim 19, wherein the phase shift is correlative to the delay elements.

27. The circuit for shifting a periodic waveform, as set forth in claim 19, wherein each of the plurality of tapping elements comprises a NOR gate.

28. The circuit for shifting a periodic waveform, as set forth in claim 19, wherein each of the plurality of tapping elements comprises a plurality of field effect transistors arranged in series with respect to each other.

29. The circuit for shifting a periodic waveform, as set forth in claim 19, wherein each of the plurality of tapping elements is coupled to one of the plurality of storage elements through one or more logical elements.

30. The circuit for shifting a periodic waveform, as set forth in claim 29, wherein the logical elements comprise NAND gates.

31. The circuit for shifting a periodic waveform, as set forth in claim 19, wherein an output of each of the tapping elements is combined in a combining circuit to produce a shifted periodic signal.

32. The circuit for shifting a periodic waveform, as set forth in claim 19, wherein each of the tapping elements produces an output and wherein each output is combined through one or more NAND gates.

33. The circuit for shifting a periodic waveform, as set forth in claim 19, wherein the periodic signal comprises a clock signal.

34. The circuit for shifting a periodic waveform, as set forth in claim 19, wherein the periodic signal comprises a 50% duty cycle.

35. A method of shifting the phase of a periodic signal comprising the acts of
  providing a periodic signal to a delay line, the periodic signal comprising a first state and a second state, and the delay line comprising a plurality of delay elements;
  measuring the number of delay elements through which the periodic signal propagates before transitioning between the first state and the second state;
  storing information in a storage device coupled to the delay line at a first point along the delay line, the information corresponding to the number of delay elements through which the periodic signal propagates before transitioning between the first state and the second state; and
  enabling a tapping element to produce an output, the tapping element being coupled to the delay line at a second point along the delay line, the second point being before the first point.

36. The method of shifting the phase of a periodic signal, as set forth in claim 35, wherein the periodic signal comprises a clock signal.

37. The method of shifting the phase of a periodic signal, as set forth in claim 35, wherein the first state comprises a logical high.

38. The method of shifting the phase of a periodic signal, as set forth in claim 35, wherein the output of tapping element comprises a phase shifted periodic signal.

39. The method of shifting the phase of a periodic signal, as set forth in claim 35, wherein the proximity of the second point along the delay line is correlative to half the number of delay elements as the proximity of the first point along the delay line.

40. The method of shifting the phase of a periodic signal, as set forth in claim 35, wherein the output comprises a 90 degree phase shifted signal correlative to the periodic signal.

41. The method of shifting the phase of a periodic signal, as set forth in claim 35, wherein the output is correlative to the delay elements.

42. The method of shifting the phase of a periodic signal, as set forth in claim 35, wherein the storage device comprises a latch.

43. The method of shifting the phase of a periodic signal, as set forth in claim 35, comprising providing a counter circuit configured to track the number of transitions between a the first state and the second state.

44. The method of shifting the phase of a periodic signal, as set forth in claim 35, wherein the counter circuit is configured to receive the periodic signal and to provide information to enable a phase shift based on a full-period of the periodic signal.

45. The method of shifting the phase of a periodic signal, as set forth in claim 35, wherein the tapping element comprises a plurality of field effect transistors.

46. A method of manufacturing a system comprising the acts of:
   providing a processor; and
   providing a memory device wherein the act of providing a memory device comprises the acts of:
      providing a delay line configured to receive a periodic signal, the delay line comprising a plurality of delay elements coupled in series;
      providing a plurality of storage elements coupled at intervals to the delay line and configured to store information corresponding to a period of the periodic signal and further configured to latch the information when a transition of the periodic signal occurs along the delay line; and
      providing a plurality of tapping elements coupled to the delay line and configured to provide a phase shift of the periodic signal.

47. The method of manufacturing a system, as set forth in claim 46, wherein the act of providing a memory device comprises the act of providing a synchronous dynamic random access memory device (SDRAM).

48. The method of manufacturing a system, as set forth in claim 47, wherein the act of providing a SDRAM comprises the act of providing a double data rate (DDR) SDRAM.

49. The method of manufacturing a system, as set forth in claim 46, wherein the act of providing a plurality of storage elements comprises the act of providing a plurality of latches.

50. The method of manufacturing a system, as set forth in claim 46, wherein the act of providing a plurality of storage elements comprises the act of providing a plurality of storage elements configured to latch the information when a transition of the periodic signal from a logical high to a logical low occurs.

51. The method of manufacturing a system, as set forth in claim 46, wherein the act of providing a plurality of storage elements comprises the act of providing a plurality of storage elements configured to latch the information when a transition of the periodic signal from a logical low to a logical high occurs.

52. The method of manufacturing a system, as set forth in claim 46, wherein the act of providing a plurality of storage elements comprises the act of providing a plurality of storage elements configured to latch the information when a transition of the periodic signal from a logical high to a logical low to a logical high occurs.

53. The method of manufacturing a system, as set forth in claim 46, wherein the act of providing a plurality of storage elements comprises the act of providing a plurality of storage elements configured to latch the information when a transition of the periodic signal from a logical low to a logical high to a logical low occurs.

54. The method of manufacturing a system, as set forth in claim 46, wherein the act of providing a plurality of tapping elements comprises the act of providing a plurality of tapping elements wherein the arrangement of the plurality of tapping elements along the delay line is correlative to the phase shift of the periodic signal.

55. The method of manufacturing a system, as set forth in claim 46, wherein the act of providing a plurality of tapping elements comprises the act of providing a plurality of tapping elements wherein the phase shift is correlative to the delay elements.

56. The method of manufacturing a system, as set forth in claim 46, wherein the act of providing a plurality of tapping elements comprises the act of providing a plurality of tapping elements wherein each of the plurality of tapping elements comprises a NOR gate.

57. The method of manufacturing a system, as set forth in claim 46, wherein the act of providing a plurality of tapping elements comprises the act of providing a plurality of tapping elements wherein each of the plurality of tapping elements comprises a plurality of field effect transistors arranged in series with respect to each other.

58. The method of manufacturing a system, as set forth in claim 46, wherein the act of providing a plurality of tapping elements comprises the act of providing a plurality of tapping elements wherein each of the plurality of tapping elements is coupled to one of the plurality of storage elements through one or more logical elements.

59. The method of manufacturing a system, as set forth in claim 58, wherein the logical elements comprise NAND gates.

60. The method of manufacturing a system, as set forth in claim 46, comprising providing a combining circuit wherein an output of each of the tapping elements is configured to be combined in the combining circuit to produce a shifted periodic signal.

61. The method of manufacturing a system, as set forth in claim 46, wherein the act of providing a plurality of tapping elements comprises the act of providing a plurality of tapping elements wherein each of the tapping elements is configured to produce an output and wherein each output is combined through one or more NAND gates.

62. The method of manufacturing a system, as set forth in claim 46, wherein the periodic signal comprises a clock signal.

63. The method of manufacturing a system, as set forth in claim 46, wherein the periodic signal comprises a 50% duty cycle.

64. A method for shifting a periodic waveform comprising the acts of:
   providing a delay line configured to receive a periodic signal, the delay line comprising a plurality of delay elements coupled in series;
   providing a plurality of storage elements coupled at intervals to the delay line and configured to store information corresponding to a period of the periodic signal and further configured to latch the information when a transition of the periodic signal occurs along the delay line; and
   providing a plurality of tapping elements coupled to the delay line and configured to provide a phase shift of the periodic signal.

65. The method for shifting a periodic waveform, as set forth in claim 64, wherein the act of providing a plurality of storage elements comprises the act of providing a plurality of latches.

66. The method for shifting a periodic waveform, as set forth in claim 64, wherein the act of providing a plurality of storage elements comprises the act of providing a plurality of storage elements configured to latch the information when a transition of the periodic signal from a logical high to a logical low occurs.

67. The method for shifting a periodic waveform, as set forth in claim 64, wherein the act of providing a plurality of storage elements comprises the act of providing a plurality of storage elements configured to latch the information when a transition of the periodic signal from a logical low to a logical high occurs.

68. The method for shifting a periodic waveform, as set forth in claim 64, wherein the act of providing a plurality of storage elements comprises the act of providing a plurality of storage elements configured to latch the information when a transition of the periodic signal from a logical high to a logical low to a logical high occurs.

69. The method for shifting a periodic waveform, as set forth in claim 64, wherein the act of providing a plurality of storage elements comprises the act of providing a plurality of storage elements configured to latch the information when a transition of the periodic signal from a logical low to a logical high to a logical low occurs.

70. The method for shifting a periodic waveform, as set forth in claim 64, wherein the act of providing a plurality of tapping elements comprises the act of providing a plurality of tapping elements wherein the arrangement of the plurality of tapping elements along the delay line is correlative to the phase shift of the periodic signal.

71. The method for shifting a periodic waveform, as set forth in claim 64, wherein the act of providing a plurality of tapping elements comprises the act of providing a plurality of tapping elements wherein the phase shift is correlative to the delay elements.

72. The method for shifting a periodic waveform, as set forth in claim 64 wherein the act of providing a plurality of tapping elements comprises the act of providing a plurality of tapping elements wherein each of the plurality of tapping elements comprises a NOR gate.

73. The method for shifting a periodic waveform, as set forth in claim 64, wherein the act of providing a plurality of tapping elements comprises the act of providing a plurality of tapping elements wherein each of the plurality of tapping elements comprises a plurality of field effect transistors arranged in series with respect to each other.

74. The method for shifting a periodic waveform, as set forth in claim 64, wherein the act of providing a plurality of tapping elements comprises the act of providing a plurality of tapping elements wherein each of the plurality of tapping elements is coupled to one of the plurality of storage elements through one or more logical elements.

75. The method for shifting a periodic waveform, as set forth in claim 74, wherein the logical elements comprise NAND gates.

76. The method for shifting a periodic waveform, as set forth in claim 64, comprising providing a combining circuit wherein an output of each of the tapping elements is configured to be combined in the combining circuit to produce a shifted periodic signal.

77. The method for shifting a periodic waveform, as set forth in claim 64, wherein the act of providing a plurality of tapping elements comprises the act of providing a plurality of tapping elements wherein each of the tapping elements is configured to produce an output and wherein each output is combined through one or more NAND gates.

78. The method for shifting a periodic waveform, as set forth in claim 64, wherein the periodic signal comprises a clock signal.

79. The method for shifting a periodic waveform, as set forth in claim 64, wherein the periodic signal comprises a 50% duty cycle.

* * * * *